(12) United States Patent
Oh et al.

(10) Patent No.: US 10,002,657 B2
(45) Date of Patent: Jun. 19, 2018

(54) ENHANCED MEMORY DEVICE

(71) Applicant: The Regents of the University of Michigan, Ann Arbor, MI (US)

(72) Inventors: Byoungchan Oh, Ann Arbor, MI (US); Sandunmalee Abeyratne, Ann Arbor, MI (US); Ronald G. Dreslinski, Jr., Ann Arbor, MI (US); Trevor Mudge, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days. days.

(21) Appl. No.: 15/081,811

(22) Filed: Mar. 25, 2016

(65) Prior Publication Data

US 2017/0278561 A1    Sep. 28, 2017

(51) Int. Cl.
*G11C 7/00* (2006.01)
*G11C 11/406* (2006.01)
*G11C 11/4074* (2006.01)
*G11C 11/408* (2006.01)
*G11C 11/4091* (2006.01)
*G11C 7/12* (2006.01)

(52) U.S. Cl.
CPC .... *G11C 11/40618* (2013.01); *G11C 11/4074* (2013.01); *G11C 11/4085* (2013.01); *G11C 11/4091* (2013.01); *G11C 7/12* (2013.01)

(58) Field of Classification Search
CPC ......... G11C 11/40611; G11C 11/40615; G11C 11/54
See application file for complete search history.

(56) References Cited

U.S. PATENT DOCUMENTS

| 6,314,028 | B1 * | 11/2001 | Kono | G11C 7/065 365/189.09 |
|---|---|---|---|---|
| 2008/0279017 | A1 * | 11/2008 | Shimano | G11C 5/063 365/189.06 |
| 2008/0291762 | A1 * | 11/2008 | Kajigaya | G11C 11/4076 365/203 |
| 2012/0127816 | A1 * | 5/2012 | Kajigaya | G11C 7/1048 365/205 |
| 2016/0064056 | A1 * | 3/2016 | Kim | G11C 8/08 365/189.11 |

\* cited by examiner

*Primary Examiner* — Uyen B Tran
(74) *Attorney, Agent, or Firm* — Pramudji Law Group PLLC; Ari Pramudji

(57) ABSTRACT

Various implementations described herein are directed to an integrated circuit. The integrated circuit may include a memory cell configured to operate in multiple retention states including a static retention state and a dynamic retention state. The integrated circuit may include a controller configured to selectively apply different voltage levels to the memory cell based on the retention state of the memory cell.

16 Claims, 8 Drawing Sheets

ENHANCED MEMORY DEVICE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In reference to integrated circuitry, dynamic random access memory (DRAM) refers to a type of memory that stores a data value in a capacitor that is accessible via a transistor. The charged or discharged state of the capacitor is used to represent the data value of a bit (i.e., 0 and 1). Since transistors typically leak a small amount of charge or voltage over time, the capacitor may slowly discharge, and as such, the stored data value fades unless capacitor charge is refreshed periodically. Due to refresh, DRAM is referred to as dynamic memory as opposed to static memory, and DRAM is referred to as a volatile type of memory because it can lose its data value when power is withdrawn.

In conventional computer systems, DRAM is typically a large power consumer. In some cases, to reduce power consumption during an idle state, the memory bus clock and unused circuitry may be disabled in self-refresh mode to reduce unnecessary power consumption. However, since DRAM cells are periodically refreshed to keep their data in self-refresh mode, power consumption still exists due to internal refresh operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to enhanced memory cells having reduced leakage current. For instance, in an implementation, described herein is a technique to enhance self-refresh modes for idle power reduction in dynamic random access memory (DRAM) cells. This technique may be implemented as a leakage current control technique to reduce DRAM idle power, wherein this technique may be applied to a DRAM cell so as to reduce idle power, and thus, reduce leakage current.

Figure 1:
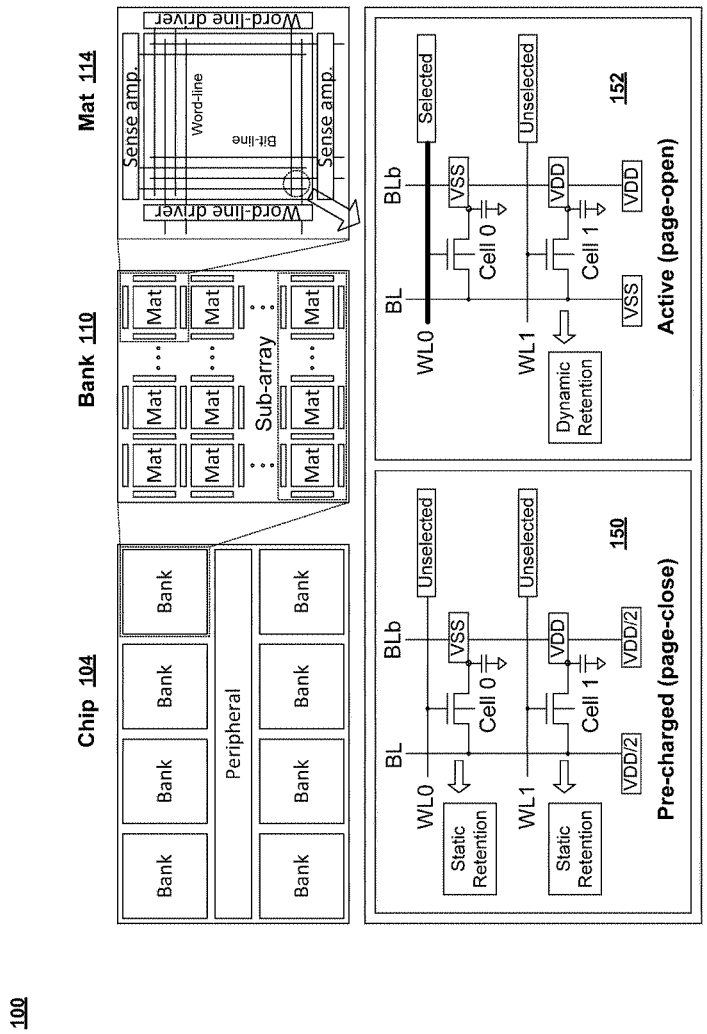
FIG. 1 illustrates a diagram of a DRAM memory device, in accordance with various implementations described herein.

FIG. 1 illustrates a diagram of a DRAM memory device 100, in accordance with various implementations described herein. As shown in FIG. 1, DRAM architecture may be divided into sub-structures including, rank, chip 104, bank 110, sub-array, MAT 114, and cell (e.g., cell 0, cell 1). In some implementations, a rank may include multiple memory chips 104, and each chip may include several banks 210 implemented as cell arrays that are independently accessible. Each bank 210 may be divided into multiple sub-arrays, and each sub-array may include multiple MATs 214. Each MAT 214 may include multiple memory cells (cell 0, cell 1) that may be sized in various configurations, such as, e.g., 512×512 storage cells in row (word-line WL) and column (bit-line BL) dimension. Each memory cell (cell 0, cell 1) may include a capacitor coupled to an access transistor, and depending on the charge or discharge state of the capacitor, each memory cell may hold a data logic value of '1' (e.g., VDD) or '0' (e.g., VSS, GND, or 0V).

Generally, DRAM cells may leak their stored charge in capacitors over time and eventually lose data. To inhibit or prevent data loss, DRAM cells are periodically refreshed within a data retention time so as to persist their data value. This retention time (refresh period) may be determined by an amount of leakage current from the DRAM cell. DRAM cells have at least two different retention states, including a static retention state and a dynamic retention state. As shown in reference to the DRAM memory device of FIG. 1, when DRAM cells are pre-charged 150 (page-closed), DRAM cells typically stay in static retention states and have small bit-line to the storage node voltage. Further, as shown in FIG. 1, when at least one DRAM cell is active or activated 152 (page-open), other DRAM cells in a same sub-array may operate in dynamic retention states, if the other DRAM cells have different data from the activated DRAM cell's data. Further, in reference to dynamic retention states, a voltage difference between bit-line and a node may be larger than the voltage difference in the static retention state.

Voltage differentials may cause a different amount of leakage current in each retention state, and the retention state of a DRAM cell may be switched when accessed. Thus, applying optimal voltage levels to both a word-line bias and body bias may reduce or at least minimize leakage current. However, in some cases, word-line bias and body bias voltage levels may remain unchanged regardless of the retention states. Because the cell state may be difficult to predict in normal operation due to varying traffic patterns, a worst case scenario may be used when setting these voltage levels. In some cases, the internal behavior of DRAM may be predictable during a self-refresh mode of operation. Since DRAM may be isolated from a memory controller during self-refresh, DRAM may perform scheduled internal operations without external commands, or in other words, retention states may be predictable during self-refresh. Therefore, some features of the present disclosure are directed to matching word-line and body voltage levels to the retention state of the memory cell (e.g., DRAM cell).

In accordance with various implementations described herein, a selective word-line bias (SWB) technique and a selective body bias (SBB) technique are provided for enhancing memory cells (e.g., DRAM cells). For instance, the SWB technique or scheme may apply at least two different voltage levels to a word-line for the static and dynamic retention states. Further, in another instance, the SBB technique or scheme may apply at least two different voltage levels to a body terminal of a cell transistor for each retention state. In various cases, selectively applying different voltage levels to the word-line and/or the body terminal may reduce or at least minimize leakage current of a memory cell, and as such, the retention time and thus the refresh period may be increased during the self-refresh mode of operation. These and other features are described in more detail in the paragraphs below.

Further, in accordance with various implementations described herein, at least two enhanced self-refresh modes (e.g., Enhanced Self-Refresh (ESR) and Long latency Self-Refresh (LSR) modes) are provided to improve power efficiency of the conventional self-refresh mode. The features of the ESR and LSR modes are configured to optimize the leakage current of DRAM cells by selectively applying different voltage levels to the DRAM cell transistors when the DRAM cells are refreshed (active) and remain idle (pre-charged) during the self-refresh mode. The ESR mode may directly replace the currently existing self-refresh mode without modification of various access protocols and/or timing parameters. Further, the LSR mode may reduce DRAM's idle power with acceptable exit latency. These and other features are described in greater detail in the paragraphs below.

Various implementations of enhancing a memory device will now be described in greater detail herein with reference to FIGS. 2A-5.

Figure 2A:
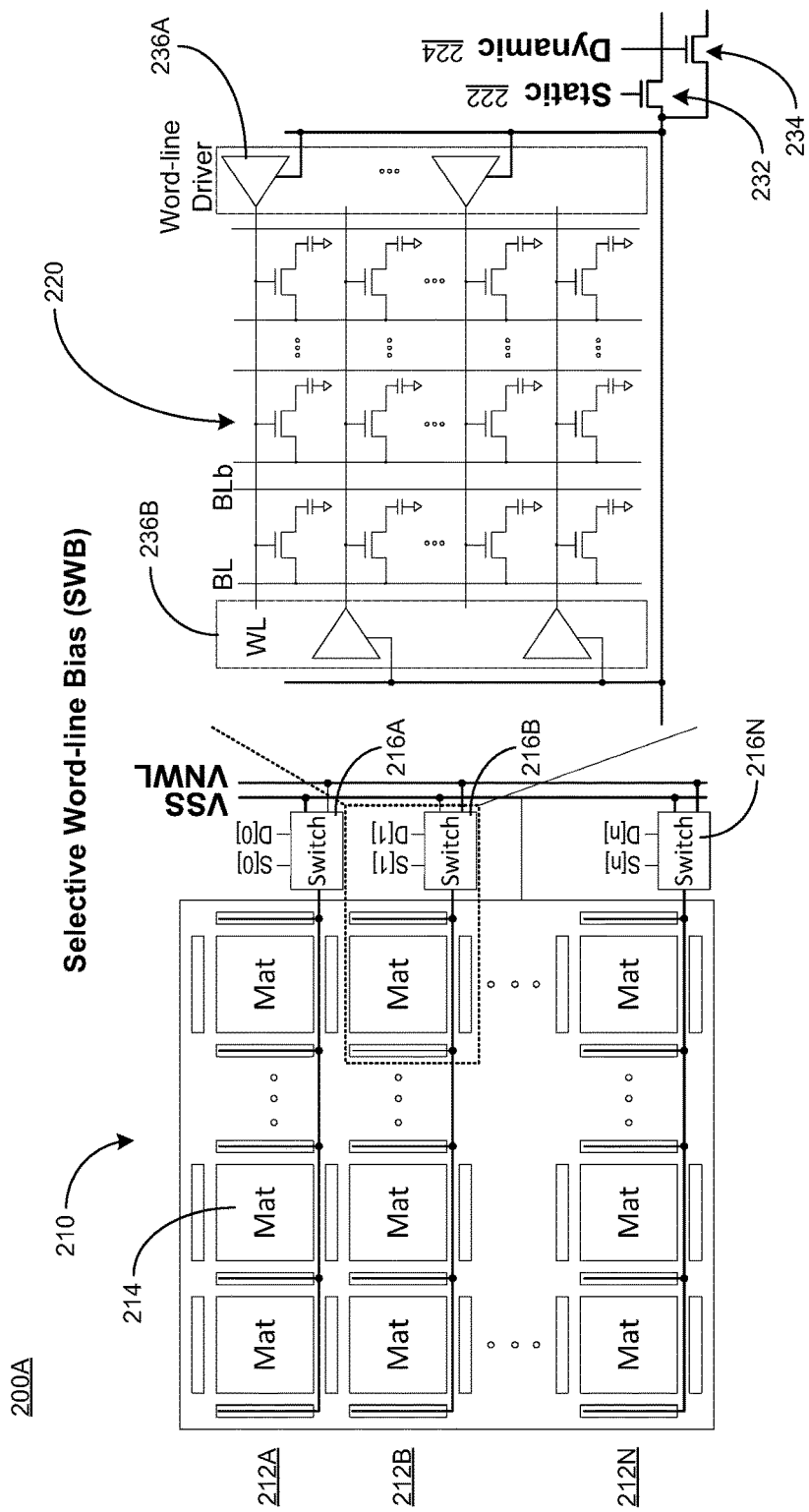
FIGS. 2A-2B illustrate a diagram of a memory device with selective word-line bias circuitry, in accordance with various implementations described herein.
Figure 2B:
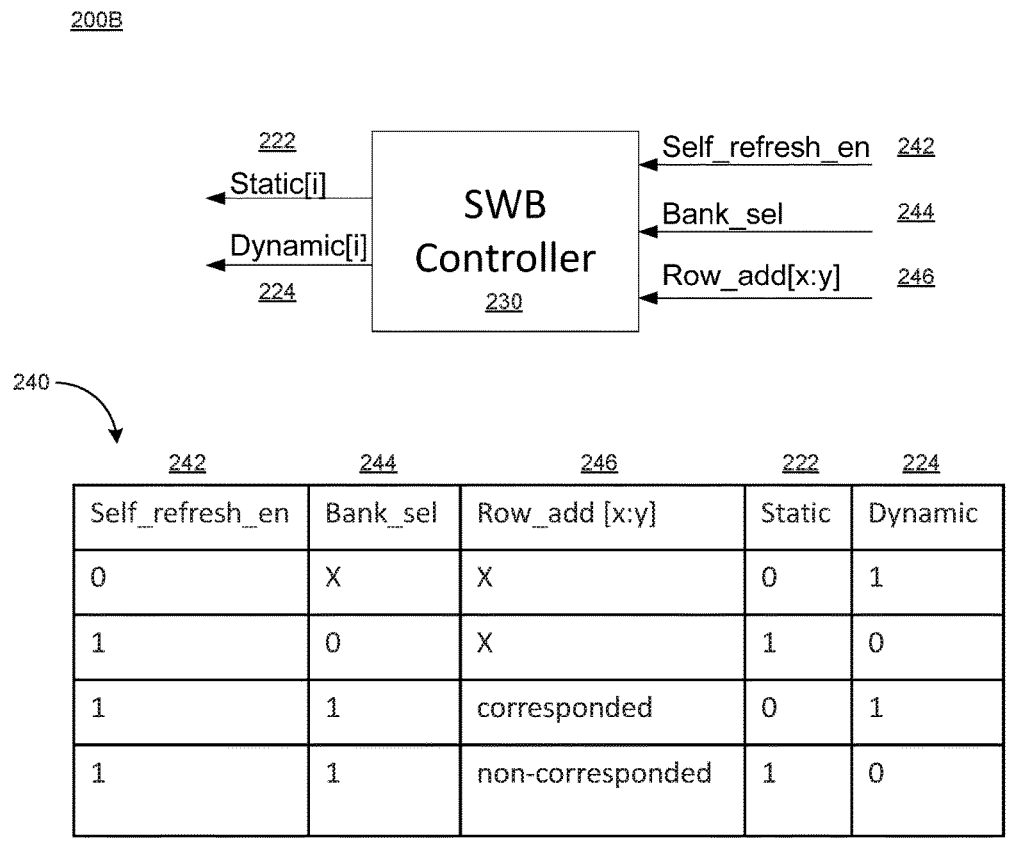

FIGS. 2A-2B illustrate a diagram of a memory device with selective word-line bias circuitry, in accordance with various implementations described herein. In particular, FIG. 2A illustrates a diagram of a memory device 200A having selective word-line bias (SWB) circuitry, and FIG. 2B illustrates a diagram of SWB control 200B for use with the selective word-line bias (SWB) circuitry in FIG. 2A.

As described herein, a rank may include multiple memory chips, and each chip may include several banks 210 implemented as cell arrays 212A, 212B, . . . , 212N that are independently accessible. In some implementations, each bank 210 may be divided into multiple sub-arrays 212A, 212B, . . . , 212N, and further, each sub-array 212A, 212B, . . . , 212N may include multiple MATs 214. Further, each MAT 214 may include multiple memory cells 220 that may be sized in various configurations. As shown in FIG. 2A, each memory cell 220 may include at least one capacitor coupled to an access transistor, and depending on the charge or discharge state of the capacitor, each memory cell 220 may hold a data logic value of '1' (e.g., VDD) or '0' (e.g., VSS, GND, or 0V).

In reference to SWB of FIGS. 2A, 2B, at least two existing voltage levels VSS, VNWL may be multiplexed with switch logic 216A, 216B, . . . , 216N (e.g., using first and second transistors 232, 234), and at least one of the voltage levels VSS, VNWL may be applied to the word-line WL via word-line driver circuits 236A, 236B. To implement SWB, at least one of the switch logic 216A, 216B, . . . , 216N (which may be implemented with at least two NMOS transistors 232, 234) may be used for each sub-array 212A, 212B, . . . , 212N. If a row is refreshed in a sub-array 212A, 212B, . . . , 212N, then the voltage level of the rows in that sub-array 212A, 212B, . . . , 212N may be VNWL with static=low (VSS) and dynamic=high (VDD). Otherwise, the voltage level of the rows in other sub-arrays 212A, 212B, . . . , 212N may be VSS with static=high (VDD) and dynamic=low (VSS). In addition to this control, if DRAM devices are not in the self-refresh mode, static=low (VSS) and dynamic=high (VDD) may be kept to match the existing design. In some cases, these static and dynamic signals may be easily generated because each sub-array 212A, 212B, . . . , 212N has its own row addresses. For above described control, an SWB controller 230 of FIG. 2B may be configured to provide control logic for generating dynamic and static signals in the row decoder region. In some cases, a control signal may be generated in a peripheral region and used to provide a notification of self-refresh, and the control signal may be transferred to one or more banks during self-refresh mode.

During operation, each memory cell 220 is configured to operate in multiple retention states including a static retention state and a dynamic retention state, and the SWB controller 230 may be configured to selectively apply different voltage levels to each memory cell 220 based on the retention state of each memory cell 220. In some cases, the SWB controller 230 is configured to match an operating voltage level of the memory cell 220 to the retention state of the memory cell 220. As described herein, each memory cell 220 may include an array of memory cells, and each memory cell 220 in the array may be configured to operate in the multiple retention states including, e.g., the static and dynamic retention states. Further, in some implementations, the SWB controller 230 may be configured to selectively apply the different voltage levels to each memory cell 220 in the array based on the retention state of each memory cell 220 in the array.

In reference to FIG. 2B, the different voltage levels may be applied to a word-line of each memory cell 220 (via the transistors 232, 234) to selectively word-line bias (SWB) each memory cell 220. The SWB controller 230 is configured to receive multiple input signals, including, e.g., self-refresh enable 242, bank select 244, and row address 246. The SWB controller 230 is configured to provide multiple output signals, including, e.g., the static (S) signal 222 and the dynamic (D) signal 224 that correspond to the static (S) and dynamic (D) signals 222, 224 received by the switch logic 216A 216B, . . . , 216N of FIG. 2A.

In some implementations, in reference to FIG. 2B, a truth table 240 may be used by the SWB controller 230 to determine state signal values for the static and dynamic signals 222, 224. For instance, based on input signal values for self-refresh enable (0), bank select (X), and row address (X), the SWB controller 230 may output a static signal value (0) and a dynamic signal value (1). In some instances, based on input signal values for self-refresh enable (1), bank select (0), and row address (X), the SWB controller 230 may output a static signal value (1) and a dynamic signal value (0). In some instances, based on input signal values for self-refresh enable (1), bank select (1), and row address (corresponded), the SWB controller 230 may output a static signal value (0) and a dynamic signal value (1). Further, in some instances, based on input signal values for self-refresh enable (1), bank select (1), and row address (non-corresponded), the SWB controller 230 may output a static signal value (1) and a dynamic signal value (0).

As shown in reference to FIG. 2A, the static signal 222 may be provided to the gate of the first transistor 232 (e.g., NMOS transistor) so as to provide the VSS signal to the word-line driver circuits 236A, 236B, when activated. The dynamic signal 234 may be provided to the gate of the second transistor 224 (e.g., NMOS transistor) so as to provide the VNWL signal to the word-line driver circuits 236A, 236B, when activated.

In some implementations, each memory cell 220 may be pre-charged to a first pre-determined voltage level (e.g., VSS) when operating in the static retention state, and each memory cell 220 may be activated to a second pre-determined voltage level (e.g., VNWL) that is different than the first pre-determined voltage level (e.g., VSS) when operating in the dynamic retention state. Thus, the SWB controller 230 may be configured to match the operating voltage level of each memory cell 220 to the first pre-determined voltage level (e.g., VSS) when the memory 220 cell is operating in the static retention state. Further, the SWB controller 230 may be configured to match the operating voltage level of each memory cell 220 to the second pre-determined voltage level (e.g., VNWL) when each memory cell 220 is operating in the dynamic retention state.

In some implementations, each memory cell 220 may be configured for operating in a self-refresh mode of operation, and thus, the SWB controller 230 may be configured to selectively apply the different voltage levels to each memory cell 220 during the self-refresh mode of operation. Further, in some implementations, a data retention time may be determined by an amount of leakage current from each memory cell 220, and as such, the SWB controller 230 may be configured to selectively apply the different voltage levels to each memory cell 220 within the data retention time during the self-refresh mode of operation. Thus, in accordance with various implementations described herein, the SWB controller 230 may be configured to increase the data retention time of each memory cell 220 in the array during the self-refresh mode of operation by selectively applying different voltage levels to each memory cell 220 (via the transistors 232, 234) in the array based on the retention state of each memory cell 220.

Figure 3A:
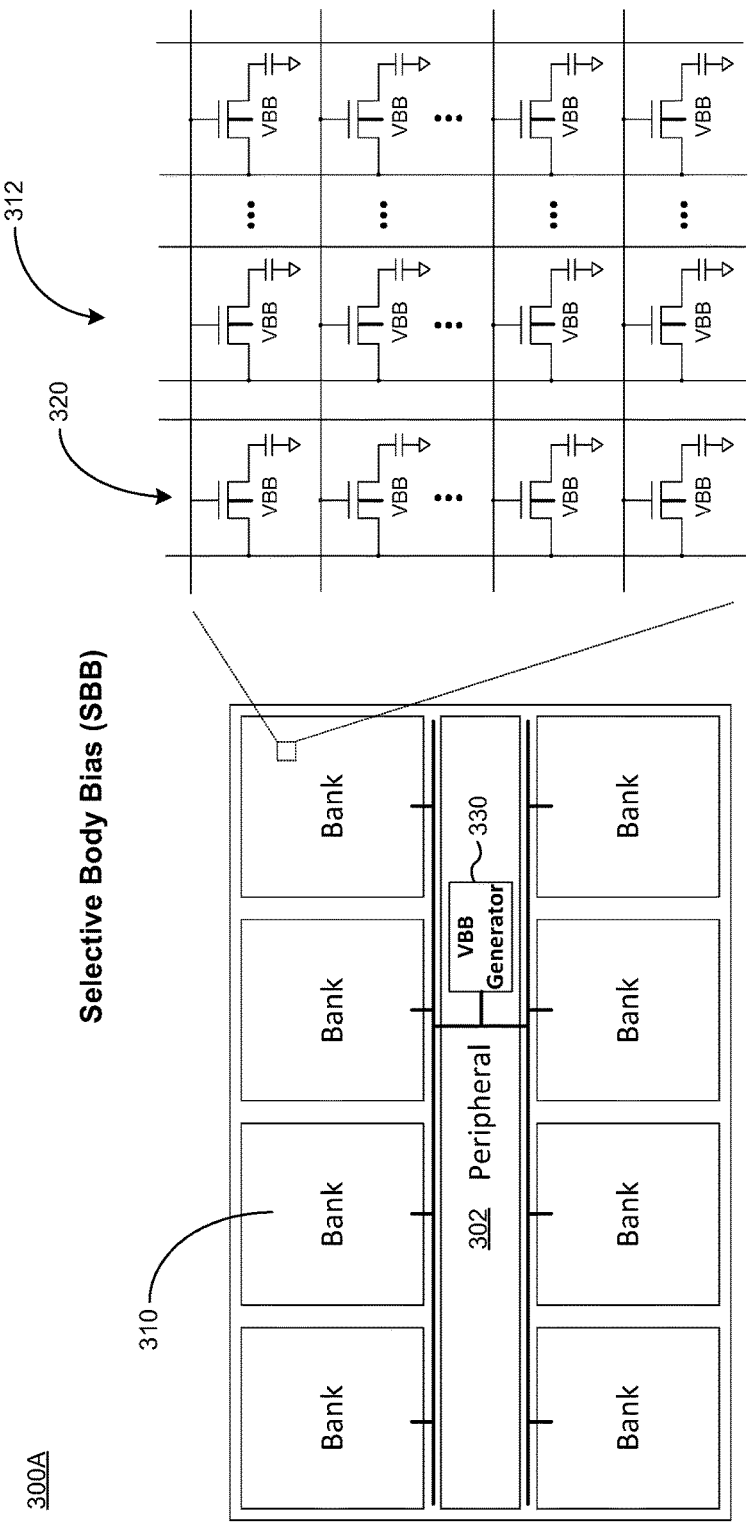
FIGS. 3A-3B illustrate a diagram of a memory device with selective body bias circuitry, in accordance with various implementations described herein.
Figure 3B:
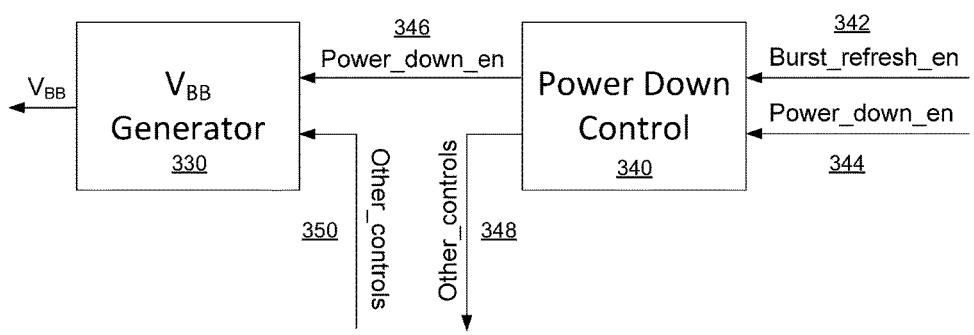

FIGS. 3A-3B illustrate a diagram of a memory device with selective body bias circuitry, in accordance with various implementations described herein. In particular, FIG. 3A illustrates a diagram of a memory device 300A having selective body bias (SBB) circuitry, and FIG. 3B illustrates a diagram of SBB control 300B for use with the selective body bias (SBB) circuitry in FIG. 3A.

As described herein, a rank may include multiple memory chips, and each chip may include several banks 310 implemented as cell arrays 312 that are independently accessible. In some implementations, each bank 310 may be divided into multiple sub-arrays 312, and further, each sub-array 312 may include multiple MATs. Further, each MAT may include multiple memory cells 320 (e.g., multiple DRAM cells) that may be sized in various configurations. As shown in FIG. 3A, each memory cell 320 may include at least one capacitor coupled to an access transistor, and depending on the charge or discharge state of the capacitor, each memory cell 320 may hold a data logic value of '1' (e.g., VDD) or '0' (e.g., VSS, GND, or 0V).

In reference to SBB of FIGS. 3A, 3B, an output voltage level VBB for body bias may be controlled with a VBB generator 330, which may be referred to as an SBB controller. As shown in FIG. 3A, the output voltage level VBB may be applied to a biasing terminal of each memory cell 320. To supply body bias voltage to the transistor for each memory cell 320, the VBB generator 330 for body bias control may be provided in a peripheral region 302. In various implementations, the memory device 300A may include one or more VBB generators 330. Further, to enable SBB, control logic and signals may be provided by the VBB generator 330 and used to change body bias voltage level of each memory cell 320 based on the retention state of each memory cell 320. Thus, the output voltage level VBB of the VBB generator 330 may be controlled based on the retention state of the memory cell 320.

In some implementations, SBB is configured to switch the body bias voltage (VBB) level from a nominal VBB level to a ground level and vice versa. DRAM includes body voltage control logic because of deep power down mode. In some cases, during the deep power down mode, the VBB level is transitioned to ground level via a power gating technique. The SBB technique described herein is configured to reuse the deep power down control logic of DRAM. For instance, when burst refresh is enabled (e.g., in LSR mode, as described in reference to FIG. 4C), VBB is transitioned to ground level. In another instance, when burst refresh is disabled, VBB returns back to its nominal level.

In reference to FIG. 3B, the different voltage levels may be applied to a body bias terminal of each memory cell 320 to selectively body bias (SBB) each memory cell 320. For instance, a power down controller 340 is configured to receive multiple input signals, including, e.g., burst refresh enable 342 and power down enable 344. The power down controller 340 is configured to provide multiple output signals, including, e.g., power down enable 342 and one or more other control signals 348. Further, the VBB generator 330 (or SBB controller) may be configured to receive multiple input signals, including, e.g., the power down enable signal 346 and one or more other control signals 350. The VBB generator 330 (or SBB controller) may be further configured to provide multiple output signals, including, e.g., the output voltage level VBB that is applied to the biasing terminal of each memory cell 320, as shown in FIG. 3A.

Figure 4A:
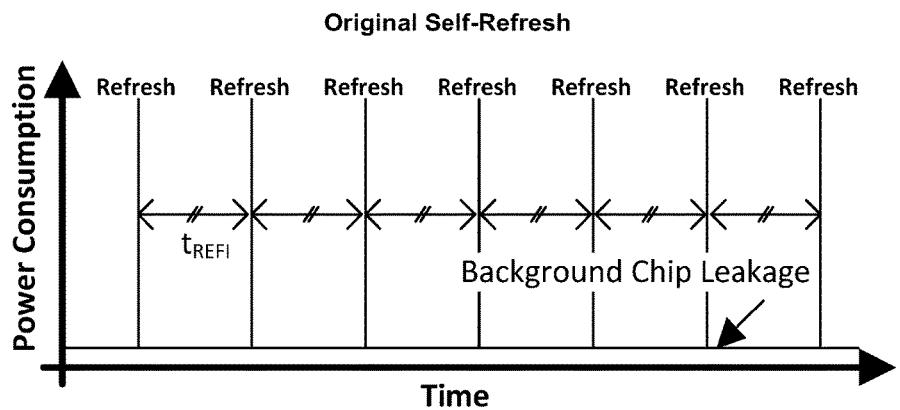
FIGS. 4A-4C illustrate various diagrams of power consumption of a memory device, in accordance with various implementations described herein.
Figure 4B:
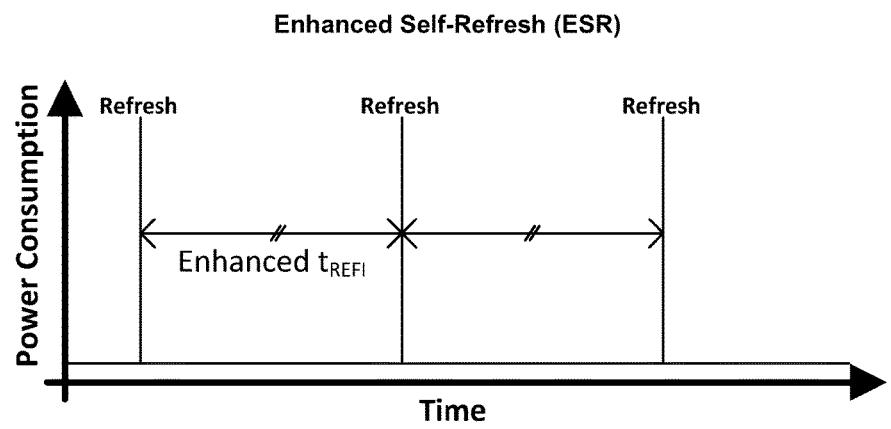
Figure 4C:
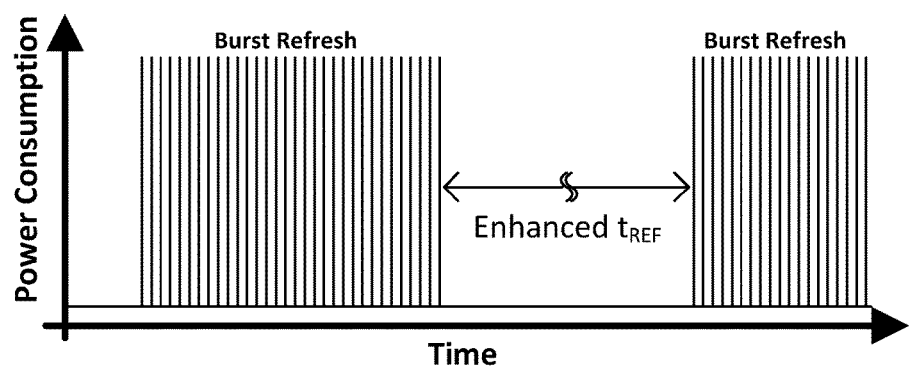

FIGS. 4A-4C illustrate various diagrams of power consumption of a memory device, in accordance with various implementations described herein. In particular, FIG. 4A illustrates a diagram 400A of power consumption of a memory device for normal self-refresh, FIG. 4B illustrates a diagram 400B of power consumption of a memory device for enhanced self-refresh (ESR), and FIG. 4C illustrates a diagram 400C of power consumption of a memory device for long latency self-refresh (LSR). Further, these diagrams 400A, 400B, 400C may also refer to cell operations.

In reference to the SWB and SBB techniques described herein, two enhanced self-refresh modes are provided, including, e.g., enhanced self-refresh (ESR) and long-latency (LSR) modes. The ESR and LSR modes may be used to improve power efficiency of the conventional self-refresh mode. The enhanced features behind the ESR and LSR modes are to optimize the leakage current of DRAM cells by selectively applying different voltage levels to the DRAM cell transistors when the DRAM cells are refreshed (active) and remain idle (pre-charged) during the self-refresh mode.

In some implementations, in the ESR mode, only SWB may be adopted. As shown in reference to FIG. 4B, SWB may not add latency on row access paths, and therefore, SWB may be adopted to the self-refresh mode without any changes to access protocols and/or timing parameters related to self-refresh entry and exit. I.e., the SWB technique may not cause modifications of a memory controller. Therefore, the ESR mode may be used to replace the currently existing self-refresh mode without any change of the memory controller and/or DRAM specification.

In some implementations, unlike SWB, SBB may bring long switching latencies. Thus, to overcome slow transitions of the body bias voltage level VBB, the LSR mode is provided. In some cases, to increase power-savings, SWB may be applied along with SBB in the LSR mode. Since SWB has no latency, applying SWB to the LSR mode may not bring additional latency. Further, in LSR mode, the refresh operation may be changed from distributed-refresh to burst-refresh as shown in reference to FIG. 4C. Burst-refresh may perform refreshes of one or more or all rows with one refresh command. Since the burst refresh for the one or more or all rows may only involve two VBB transitions when the burst refresh starts and finishes, time overhead of the VBB transition may be reduced. Further, in some cases, the LSR mode may not replace the currently existing self-refresh mode, and therefore, another self-refresh mode may be added on the JEDEC standard (Joint Electron Device Engineering Council Standard).

Figure 5:
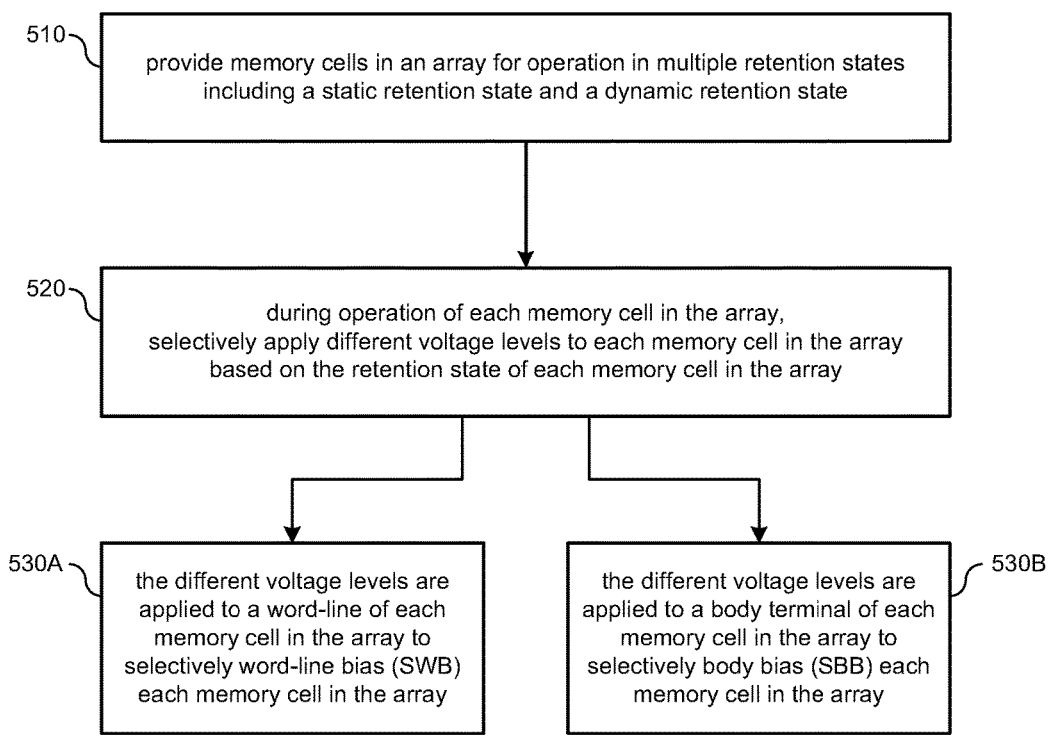
FIG. 5 illustrates a method for providing an enhanced memory device, in accordance with various implementations described herein.

FIG. 5 illustrates a method 500 for providing an enhanced memory device, in accordance with various implementations described herein.

It should be understood that even though method 500 may indicate a particular order of execution of operations, in some instances, various certain portions of the operations may be executed in a different order, and on different systems. In some other instances, additional operations or steps may be added to and/or omitted from method 500. The method 500 may be implemented in hardware and/or software. If implemented in hardware, the method 500 may be implemented with various circuit components, such as described herein above in reference to FIGS. 2A-4. If implemented in software, the method 500 may be implemented as a program or software instruction process that may be configured for enhancing a memory device. Further, if implemented in software, instructions related to implementing the method 500 may be stored in memory and/or a database. For instance, a computer or various other computing devices having a processor and memory may be configured to perform method 500.

In various implementations, method 500 is directed to providing an enhanced memory device. In some cases, the memory cell may include some or more memory cells, such as, e.g., one or more DRAM cells. In some other cases, the memory cell may include an array of memory cells, wherein each memory cell in the array is configured to operate in multiple retention states including the static and dynamic retention states. In this case, the controller may be configured to selectively apply the different voltage levels to each memory cell in the array based on the retention state thereof.

For instance, at block 510, method 500 may provide a plurality of memory cells in an array for operation in multiple retention states. The retention states may include a static retention state and a dynamic retention state. At block 520, during operation of each memory cell in the array, method 500 may selectively apply different voltage levels to each memory cell in the array based on the retention state of each memory cell in the array. At block 530A, method 500 may apply the different voltage levels to a word-line of each memory cell in the array to selectively word-line bias (SWB) each memory cell in the array. Otherwise, at block 530B, method 500 may apply the different voltage levels to a body terminal of each memory cell in the array to selectively body bias (SBB) each memory cell in the array.

In some implementations, method 500 may match an operating voltage level of each memory cell in the array to the retention state thereof. For instance, method 500 may match the operating voltage level of a memory cell in the array to the static retention state, if the memory cell is operating in the static retention state. In another instance, method 500 may match the operating voltage level of a memory cell in the array to the dynamic retention state, if the memory cell is operating in the dynamic retention state.

Various implementations described herein are directed to addressing non-trivial power consumption of memory cells (e.g., DRAM cells), which still remains due to internal refresh operations. Therefore, the SWB and SBB techniques described herein are used to increase refresh period and thus reduce refresh power without large area overhead and modification of the memory controller. For instance, since leakage current of DRAM cells varies according to their retention states, this voltage differential may cause different leakage current. Further, word-line and body bias voltage levels may remain unchanged regardless of the retention states, and thus, the retention states of DRAM cells may be switched when accessed. In some cases, applying optimal voltage levels to word-line and body bias may reduce or minimize the leakage current. Further, the internal behavior of DRAM cells is predictable during self-refresh mode, and since DRAM cells are isolated from the memory controller during self-refresh, DRAM cell may only perform scheduled internal operations without external accesses. I.e., retention states are predictable during self-refresh. Thus, various implementations described herein are directed to matching the voltage level to the state of the DRAM cell. Although the voltage level across the cell transistor is different according to state of the cell, the word-line and body bias levels may remain unchanged regardless of the retention states because of difficulty to predict the cell state. Therefore, to eliminate this unfairness, the SWB and SBB techniques to selectively apply different optimum voltage levels to each cell retention state by exploiting characteristics of the self-refresh mode where the retention state of the cell may be periodically changed.

Described herein are various implementations of an integrated circuit. The integrated circuit may include a memory cell configured to operate in multiple retention states including a static retention state and a dynamic retention state. The integrated circuit may include a controller configured to selectively apply different voltage levels to the memory cell based on the retention state of the memory cell.

Described herein are various implementations of a device. The device may include an array of memory cells, wherein each memory cell is configured to operate in multiple retention states including static and dynamic retention states. The device may include a controller configured to selectively apply different voltage levels to each memory cell in the array based on the retention state of each memory cell in the array.

Described herein are various implementations of a method. The method may include providing a plurality of memory cells in an array for operation in multiple retention states including a static retention state and a dynamic retention state. During operation of each memory cell in the array, the method may include selectively applying different voltage levels to each memory cell in the array based on the retention state of each memory cell in the array.

Various implementations described herein provide two new self-refresh modes, including the ESR mode and the LSR mode. As described herein, the ESR mode makes use of the selective word-line bias (SWB) technique, and the ESR mode may directly replace the currently existing self-refresh mode without modification of access protocols and timing parameters. Further, as described herein, the LSR mode makes use of the selective body bias (SBB) technique in combination with SWB, and the LSR mode may bring larger power reduction in the idle state with acceptable exit latency.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessorbased systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a memory cell configured to operate in multiple retention states including a static retention state and a dynamic retention state; and
   a controller configured to selectively apply different voltage levels to a word-line of the memory cell based on the retention state of the memory cell to selectively word-line bias (SWB) the memory cell with switch logic using a first transistor that is activated based on a first signal for selecting the static retention state and a second transistor that is activated based on a second signal for selecting the dynamic retention state, wherein the second signal is different than the first signal,
   wherein the memory cell is pre-charged to a first pre-determined voltage level when operating in the static retention state,
   wherein the memory cell is activated to a second pre-determined voltage level that is different than the first pre-determined voltage level when operating in the dynamic retention state, and wherein the first pre-determined voltage level comprises VSS.

2. The integrated circuit of claim 1, wherein the controller is configured to match an operating voltage level of the memory cell to the retention state of the memory cell.

3. The integrated circuit of claim 1, wherein the controller is configured to match an operating voltage level of the memory cell to the first pre-determined voltage level when the memory cell is operating in the static retention state.

4. The integrated circuit of claim 1, wherein the controller is configured to match an operating voltage level of the memory cell to the second pre-determined voltage level when the memory cell is operating in the dynamic retention state.

5. The integrated circuit of claim 1, wherein:
the memory cell is configured for operating in a self-refresh mode of operation, and
the controller selectively applies the different voltage levels to the memory cell during the self-refresh mode of operation.

6. The integrated circuit of claim 5, wherein:
the controller is configured to selectively apply the different voltage levels to the memory cell within a data retention time during the self-refresh mode of operation, wherein the data retention time is determined by an amount of leakage current from the memory cell.

7. The integrated circuit of claim 6, wherein the controller is configured to increase the data retention time of the memory cell during the self-refresh mode of operation by selectively applying the different voltage levels to the memory cell based on the retention state of the memory cell.

8. The integrated circuit of claim 1, wherein the memory cell comprises a dynamic random access memory (DRAM) cell.

9. The integrated circuit of claim 1, wherein:
the memory cell comprises an array of memory cells,
each memory cell in the array is configured to operate in multiple retention states including the static and dynamic retention states, and
the controller is configured to selectively apply the different voltage levels to each memory cell in the array based on the retention state of each memory cell in the array.

10. An integrated circuit, comprising:
a memory cell configured to operate in multiple retention states including a static retention state and a dynamic retention state; and
a controller configured to selectively apply different voltage levels to a body terminal of the memory cell based on the retention state of the memory cell to selectively body bias (SBB) the memory cell using control logic to change a body bias voltage level of the memory cell based on the retention state of the memory cell, wherein the body terminal of the memory cell is different than the gate terminal of the memory cell,
wherein the memory cell is pre-charged to a first pre-determined voltage level when operating in the static retention state,
wherein the memory cell is activated to a second pre-determined voltage level that is different than the first pre-determined voltage level when operating in the dynamic retention state, and
wherein the first pre-determined voltage level comprises VSS.

11. A device, comprising:
an array of memory cells, wherein each memory cell is configured to operate in multiple retention states including static and dynamic retention states; and
a controller configured to selectively apply different voltage levels to a word-line of each memory cell in the array based on the retention state of each memory cell in the array to selectively word-line bias (SWB) each memory cell in the array with switch logic using a first transistor that is activated based on a first signal for selecting the static retention state and a second transistor that is activated based on a second signal for selecting the dynamic retention state, wherein the second signal is different than the first signal,
wherein each memory cell is pre-charged to a first pre-determined voltage level when operating in the static retention state,
wherein each memory cell is activated to a second pre-determined voltage level that is different than the first pre-determined voltage level when operating in the dynamic retention state, and
wherein the first pre-determined voltage level comprises VSS.

12. The device of claim 11, wherein the controller is configured to match an operating voltage level of each memory cell in the array to the retention state thereof.

13. A device, comprising:
an array of memory cells, wherein each memory cell is configured to operate in multiple retention states including static and dynamic retention states; and
a controller configured to selectively apply different voltage levels to a body terminal of each memory cell in the array based on the retention state of each memory cell in the array to selectively body bias (SBB) each memory cell in the array using control logic to change a body bias voltage level of each memory cell in the array based on the retention state of each memory cell in the array, wherein the body terminal of the memory cell is different than the gate terminal of the memory cell,
wherein each memory cell is pre-charged to a first pre-determined voltage level when operating in the static retention state,
wherein each memory cell is activated to a second pre-determined voltage level that is different than the first pre-determined voltage level when operating in the dynamic retention state, and
wherein the first pre-determined voltage level comprises VSS.

14. A method, comprising:
providing a plurality of memory cells in an array for operation in multiple retention states including a static retention state and a dynamic retention state; and
during operation of each memory cell in the array, selectively applying different voltage levels to a word-line of each memory cell in the array based on the retention state of each memory cell in the array to selectively word-line bias (SWB) each memory cell in the array with switch logic using a first transistor that is activated based on a first signal for selecting the static retention state and a second transistor that is activated based on a second signal for selecting the dynamic retention state, wherein the second signal is different than the first signal,
wherein each memory cell is pre-charged to a first pre-determined voltage level when operating in the static retention state, wherein each memory cell is activated to a second pre-determined voltage level that is different than the first pre-determined voltage level when operating in the dynamic retention state, and wherein the first pre-determined voltage level comprises VSS.

15. The method of claim 14, further comprising matching an operating voltage level of each memory cell in the array to the retention state thereof.

16. A method, comprising:

providing a plurality of memory cells in an array for operation in multiple retention states including a static retention state and a dynamic retention state; and during operation of each memory cell in the array, selectively applying different voltage levels to a body terminal of each memory cell in the array based on the retention state of each memory cell in the array to selectively body bias (SBB) each memory cell in the array using control logic to change a body bias voltage level of each memory cell in the array based on the retention state of each memory cell in the array, wherein the body terminal of the memory cell is different than the gate terminal of the memory cell, wherein each memory cell is pre-charged to a first pre-determined voltage level when operating in the static retention state, wherein each memory cell is activated to a second pre-determined voltage level that is different than the first pre-determined voltage level when operating in the dynamic retention state, and wherein the first pre-determined voltage level comprises VSS.

* * * * *